United States Patent
Young et al.

(10) Patent No.: US 7,205,614 B2
(45) Date of Patent: Apr. 17, 2007

(54) HIGH DENSITY ROM CELL

(75) Inventors: Sheng-Tai Young, Hsin-Chu Hsien (TW); Te-Sun Wu, Hsin-Chu (TW); Tsung-Yuan Lee, Tai-Chung (TW); Chih-Kang Chiu, Hsin-Chu Hsien (TW)

(73) Assignee: Faraday Technology Corp., Hsin-Chu (TW)

( * ) Notice: Subject to any disclaimer, the term of this patent is extended or adjusted under 35 U.S.C. 154(b) by 101 days.

(21) Appl. No.: 10/707,703

(22) Filed: Jan. 6, 2004

(65) Prior Publication Data

US 2005/0145948 A1    Jul. 7, 2005

(51) Int. Cl.
*H01L 29/76* (2006.01)
*H01L 29/40* (2006.01)

(52) U.S. Cl. ............... 257/367; 257/368; 257/372; 257/373; 257/288; 257/390

(58) Field of Classification Search ............ 257/362, 257/361, 364, 365, 366, 367, 363
See application file for complete search history.

(56) References Cited

U.S. PATENT DOCUMENTS

| | | | | |
|---|---|---|---|---|
| 4,422,092 A | * | 12/1983 | Guterman | 357/41 |
| 5,677,215 A | * | 10/1997 | Goo | 438/257 |
| 5,825,069 A | * | 10/1998 | Wen et al. | 257/390 |
| 5,893,738 A | * | 4/1999 | Chen et al. | 438/275 |
| 5,933,732 A | * | 8/1999 | Lin et al. | 438/264 |
| 6,751,111 B2 | * | 6/2004 | Foss et al. | 365/49 |

* cited by examiner

*Primary Examiner*—Leonardo Andujar
*Assistant Examiner*—Fazli Erdem
(74) *Attorney, Agent, or Firm*—Winston Hsu

(57) ABSTRACT

A high density read-only memory (ROM) cell is installed on a silicon substrate for storing data. The ROM cell includes a first doped region being of a second conductive type installed on the silicon substrate, a plurality of first heavily doped regions being of a first conductive type installed in the first doped region, a second doped region being of the second conductive type installed on the silicon substrate, and a gate installed on the surface of the silicon substrate and adjacent to the first doped region and the second doped region.

13 Claims, 10 Drawing Sheets

HIGH DENSITY ROM CELL

BACKGROUND OF INVENTION

1. Field of the Invention

The invention relates to a high density read-only memory (ROM) cell, and more particularly, to a high density ROM cell having a structure similar to a metal oxide semiconductor (MOS) transistor.

2. Description of the Prior Art

As semiconductor technology progresses, circuits manufactured by semiconductor technology are widely used in electronic devices and computer systems. One example of these circuits is a ROM. The prior art combines MOS transistors with peripheral circuits to form ROMs. However, each of theses ROMs can only store one bit data. Since circuit area corresponds to the number of MOS transistors and peripheral circuits, a high capacity memory circuit will occupy a large area on a semiconductor chip. As a result, high capacity memory circuits cannot be satisfactorily integrated on a single wafer.

Please refer to FIG. 1 showing a circuit diagram of a conventional ROM cell, wherein each MOS transistor is a ROM. As described above, each ROM cell can store only one bit of data; the data can be read under the control of word lines WL0, WL1, WL2, WL3 . . . (four word lines are shown in FIG. 1) and bit lines BL0, BL1 . . . (two bit lines are shown in FIG. 1).

As described above, in the conventional memory circuit, each ROM cell can store only one bit of data, and the circuit area corresponds to the number of these transistors and peripheral circuits. Thus, a high capacity memory circuit occupies a large area on a semiconductor chip, which means that high capacity memory circuits cannot be satisfactorily integrated on a single wafer. Accordingly, the cost of a high capacity memory circuit cannot be reduced, and the capacity of ROM is hardly improved. Thus, the prior art retains disadvantages which can be improved upon.

SUMMARY OF INVENTION

It is therefore a primary objective of the claimed invention to provide a high density ROM cell to solve the problem mentioned above.

Briefly, a ROM cell is installed on a silicon substrate for storing data. The ROM cell includes a first doped region being of a second conductive type installed on the silicon substrate, a plurality of first heavily doped regions being of a first conductive type installed in the first doped region, a second doped region being of the second conductive type installed on the silicon substrate, and a gate installed on the surface of the silicon substrate and adjacent to the first doped region and the second doped region.

The present invention further provides a high density ROM cell installed on a silicon substrate for storing data. The ROM cell includes a plurality of first doped regions being of a second conductive type installed on the silicon substrate, a second doped region being of the second conductive type installed on the silicon substrate, and a gate installed on the surface of the silicon substrate and adjacent to the plurality of first doped regions and the second doped region.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a high density ROM cell having a structure similar to a MOS transistor. The memory cell includes a plurality of drains, a common gate, and a common source. Since such kind of the structure composed of the common devices provides a manner for operating a plurality of drain signals, a single memory cell can store a plurality of bits of data, which is of higher density than that in the prior art. According to the first embodiment of the present invention, the plurality of drains are installed in a common drain doped region having a plurality of heavily doped regions, wherein each heavily doped region and the common doped drain region form a diode so that the plurality of drain signals passing through the plurality of heavily doped regions do not interfere with each other. In the second embodiment of the present invention, the plurality of drains are the plurality of drain doped regions separated by at least one extension structure of the common gate.

Figure 1:
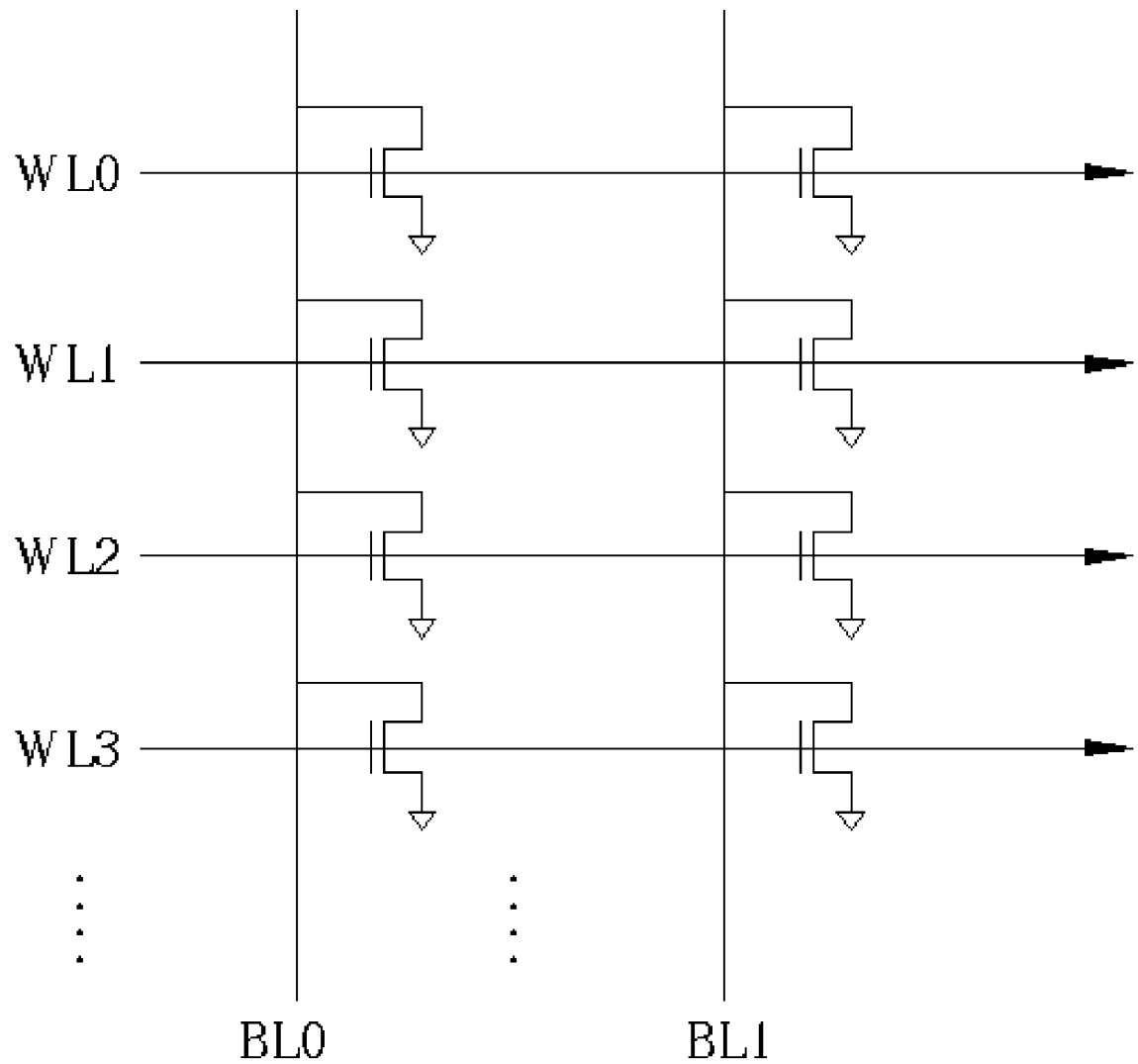
FIG. 1 is a circuit diagram of a conventional ROM cell.
Figure 2:
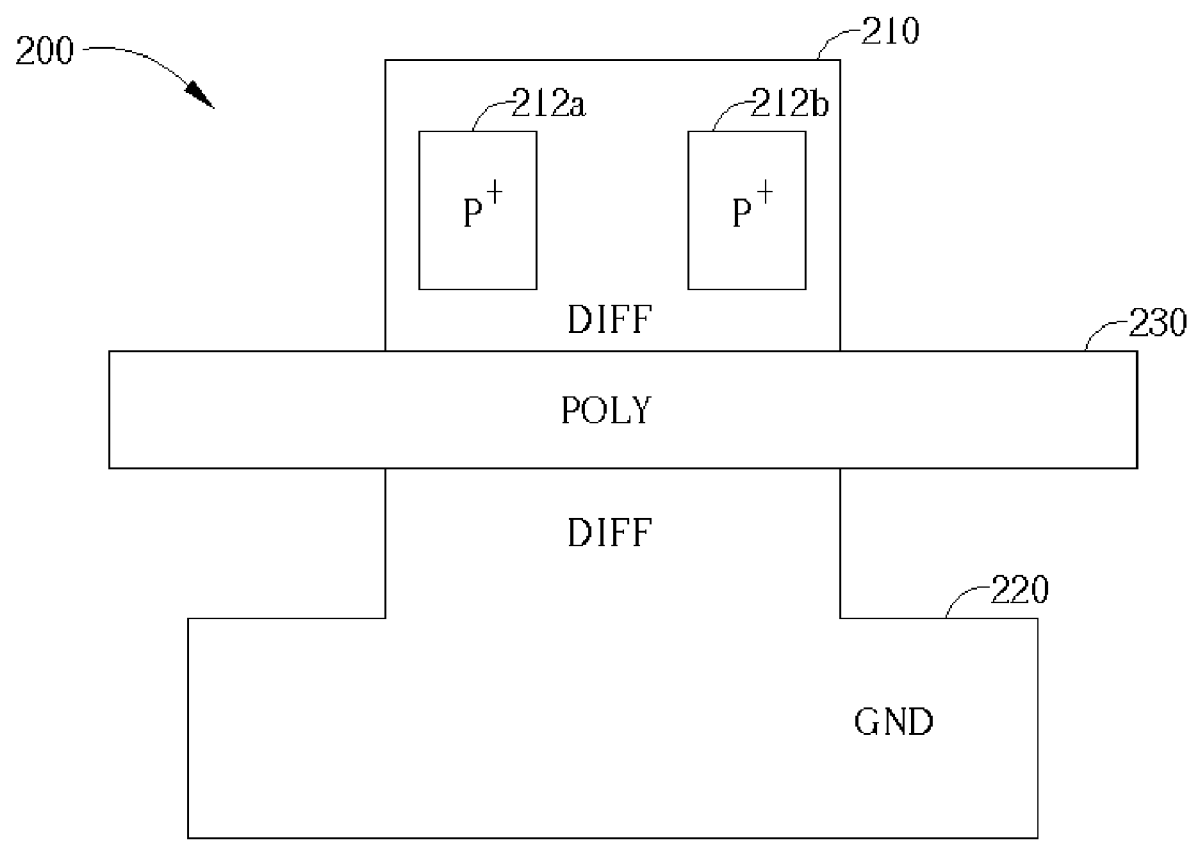
FIG. 2 is a block diagram of the ROM cell according to the first embodiment of the present invention.
Figure 3:
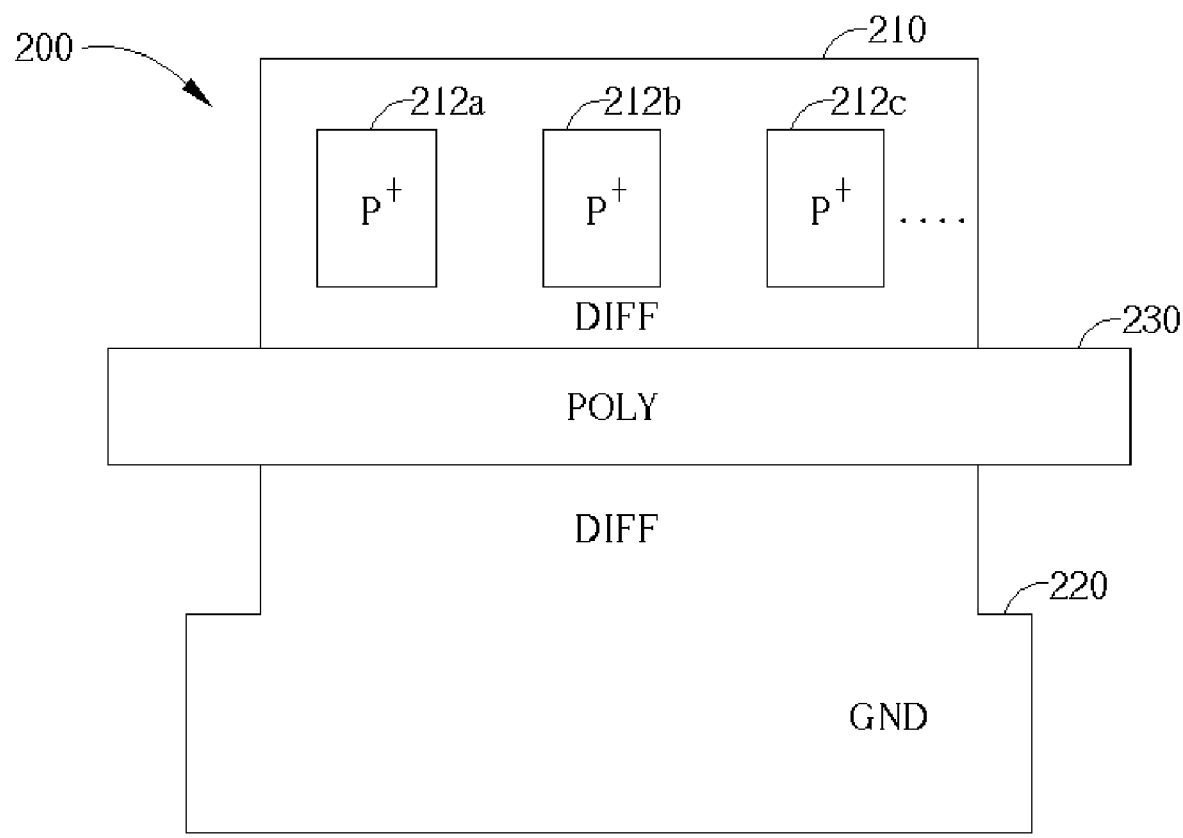
FIG. 3 is a block diagram of an optimal variation of the ROM cell shown in FIG. 2.

Please refer to FIG. 2 showing a block diagram of the ROM cell, and FIG. 3 showing a block diagram of an optimal variation of the ROM cell shown in FIG. 2, both of which are according to the first embodiment of the present invention. A gate 230 according to the first embodiment is made of polysilicon (POLY in FIG. 2 and the following figures). A common drain doped region 210 and a common source doped region 220 are doped wells formed by a diffusion process (DIFF in FIG. 2 and the following figures). In other related figures, such as FIG. 2, FIG. 3, FIG. 4, FIG. 7, FIG. 8, "P+" and "N+" represent respectively a P-type doped well having a higher relative doping density than that of a surrounding N-type well and a N-type doped well having a higher relative doping density than that of a surrounding P-type well. GND represents that the common source of the ROM cell is grounded.

The difference between FIG. 3 and FIG. 2 is the number of the heavily doped regions 212a, 212b, 212c . . . The number of these heavily doped regions represents how many bits the ROM cell can store, which is equal to the number of drain signals employed. For instance, a ROM cell 200 having 5 heavily doped regions 212a, 212b, 212c, 212d, 212e (212d and 212e are not shown in FIG. 3) can store 5 bits. The following description is related to the first embodiment shown in FIG. 2, wherein the ROM cell 200 has 2 heavily doped regions 212a, 212b for storing 2 bits.

According to the first embodiment shown in FIG. 2, the present invention provides a high density ROM cell 200 installed on a silicon substrate for storing data. The ROM cell 200 includes a first doped region 210 installed on the silicon substrate having a second conductive type (N-type in this embodiment; that is, the first doped region 210 is an N-type doped well), a plurality of first heavily doped regions 212a, 212b (two in this embodiment) installed in the first doped region 210 and having a first conductive type (P-type in this embodiment; that is, the first heavily doped regions 212a, 212b are P-type doped wells), a second doped region 220 installed on the silicon substrate having the second conductive type (N-type doped well), and a gate 230 installed on the surface of the silicon substrate and adjacent to the first doped region 210 and the second doped region 220. The first doped region 210 is a drain doped region; the second doped region 220 is a source doped region. Each first heavily doped region of the plurality of heavily doped regions 212a, 212b forms a diode in cooperation with the first doped region 210 (described hereinafter) so that the plurality of drain signals (two in this embodiment, not shown in FIG. 2) respectively passing through the plurality of heavily doped regions 212a, 212b will not interfere with each other.

Figure 4:
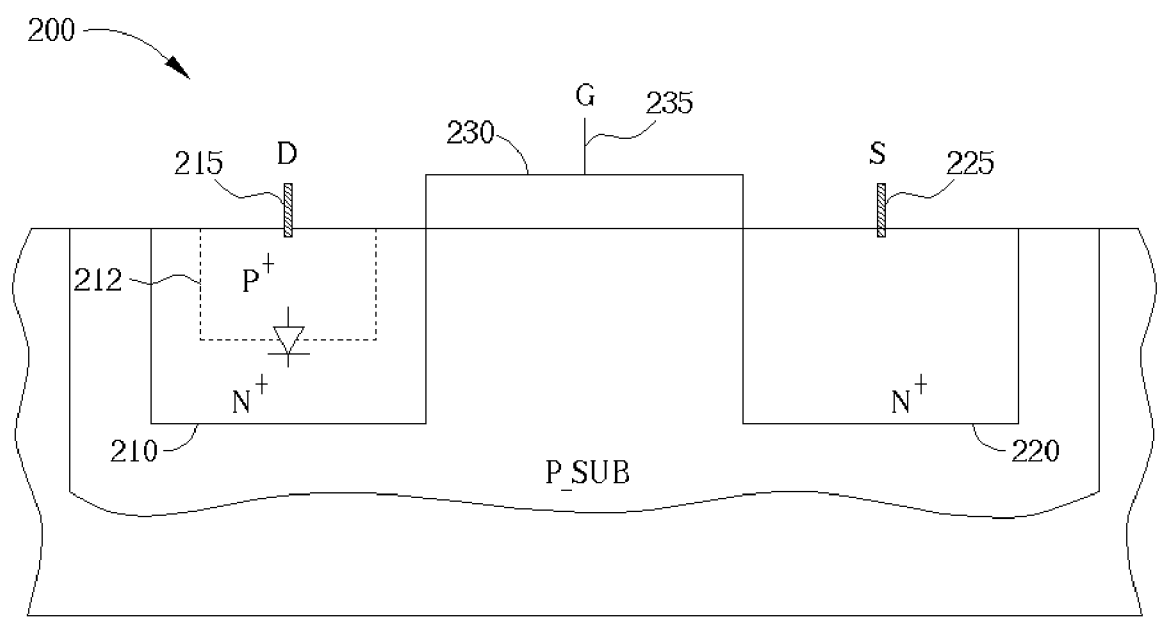
FIG. 4 illustrates a cross-section view of the ROM cell according to the first embodiment of the present invention.

Please refer to FIG. 2 as well as FIG. 4 showing a cross-section view of the ROM cell 200. In this embodiment, the ROM cell 200 is installed in a doped well on the silicon substrate (P_SUB, P-Substrate in FIG. 4), and the doped well has the first conductive type (P-type in this embodiment; that is, the doped well is a P-type doped well). Such kind of structure is optional and does not limit the present invention. Moreover, the diode mentioned above is marked by a diode mark between the heavily doped region 212 (representing the heavily doped regions 212a, 212b) and the first doped region 210 in FIG. 4. When a first drain signal current (not shown) composed of the drain signals flows in sequence from a drain terminal 215 through the heavily doped region 212 (representing the heavily doped regions 212a, 212b) and the first doped region 210, and even in the event it passes through the silicon substrate (in this embodiment, pass through the region adjacent to the gate 230 in the P-type doped well shown as P_SUB) and the second doped region 220 to the source terminal 225 under control of the gate 230, the diode can prevent the first drain signals from flowing between the heavily doped regions 212a, 212b. Therefore, the plurality of drain signals (two in this embodiment, not shown in FIG. 2) respectively passing through the plurality of heavily doped regions 212a, 212b will not interfere with each other.

Figure 5:
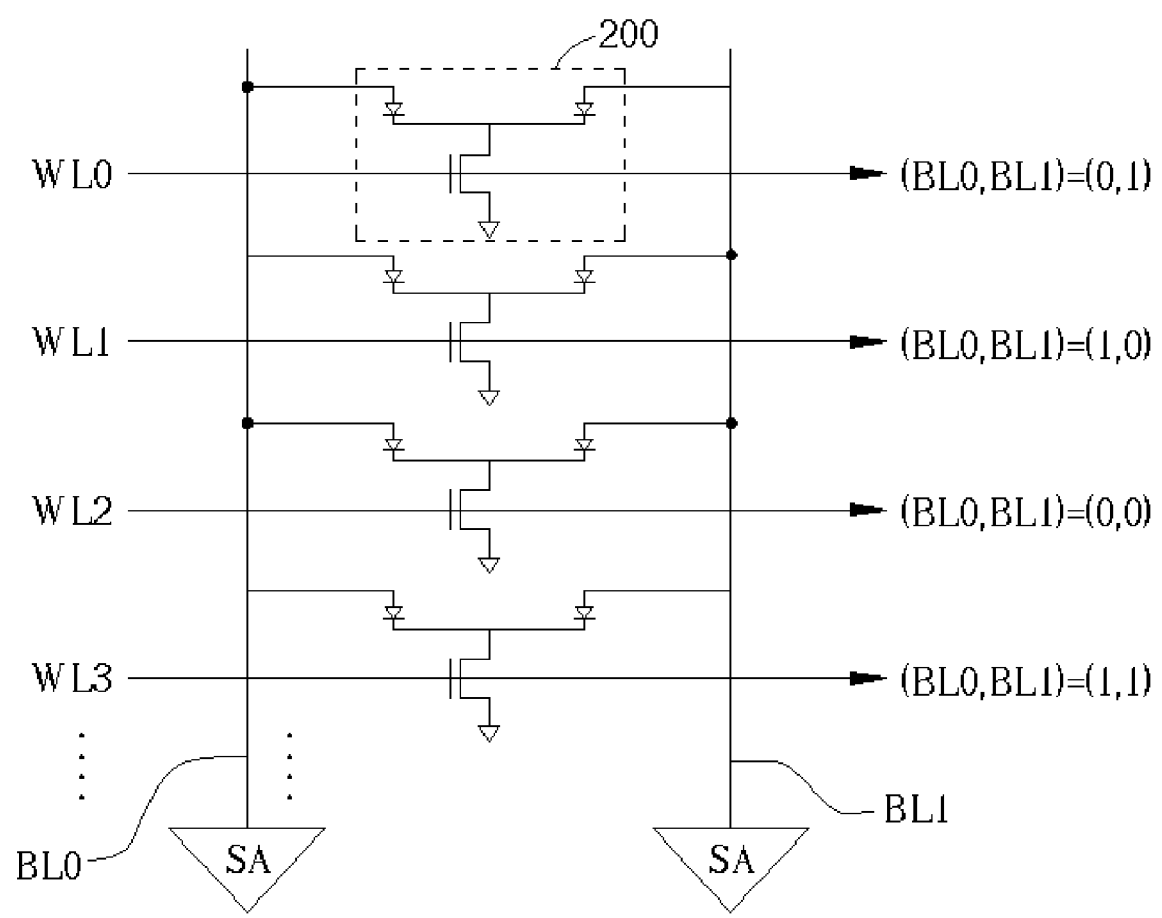
FIG. 5 is a circuit diagram of the ROM cell array according to the first embodiment of the present invention.
Figure 6:
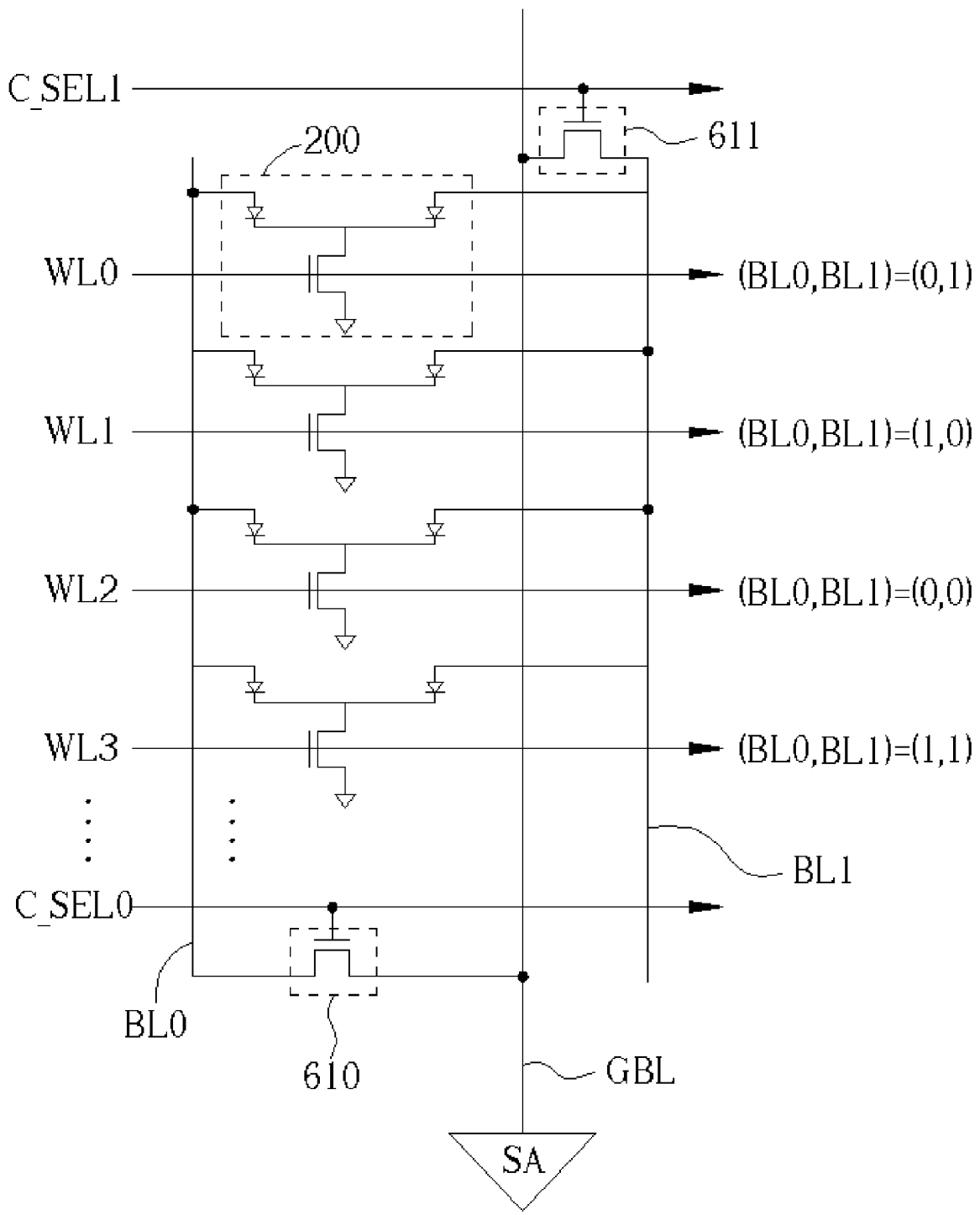
FIG. 6 illustrates a combination of the circuit in FIG. 5 and a global bit line.

Please refer to FIG. 5 showing a circuit diagram of the ROM cell array, and FIG. 6 showing a combination of the circuit in FIG. 5 and a global bit line. The ROM cell 200 in FIG. 5 and FIG. 6 is an equivalent circuit to the ROM cell 200 in FIG. 2 and FIG. 4, wherein a single ROM cell 200 can store a plurality of bits (2 bits in this embodiment) of data in order to provide a higher density on data storage. As shown in FIG. 5 and FIG. 6, the plurality of bits of data can be read by a plurality of bit lines BL0, BL1 (two in this embodiment). As shown in FIG. 5, the data read by the bit line BL0, BL1 are transmitted to a bit line output SA. The global bit line GBL in FIG. 6 controls a plurality of bit line switches 610, 611 through a plurality of column selection lines C_SEL0, C_SEL1 corresponding to the bit lines BL0, BL1, to multiplex data read by one of the bit lines BL0, BL1 and transmit them to the bit line output SA. In other words, the circuit in FIG. 6 is a combination of the circuit in FIG. 5 and a Y-multiplexer (Y-MUX). Therefore, both FIG. 5 and FIG. 6 show that the present invention provides higher storage density than the prior art. In addition, bit read values (BL0, BL1)=(0, 1), (1, 0), (0, 1), (1, 1) marked on the right side of word lines WL0, WL1, WL2, WL3 in FIG. 5 and FIG. 6 correspond to the drain terminal 215 and the programmed (shown by a black dot) or unprogrammed (without black dot) status between the bit lines BL0, BL1 of each ROM cell 200.

In the present invention, the first conductive type is P-type and the second conductive type is N-type. However, it is optional and does not limit the present invention. In another possible embodiment of the present invention, the first conductive type can be N-type and the second conductive type can be P-type.

Figure 7:
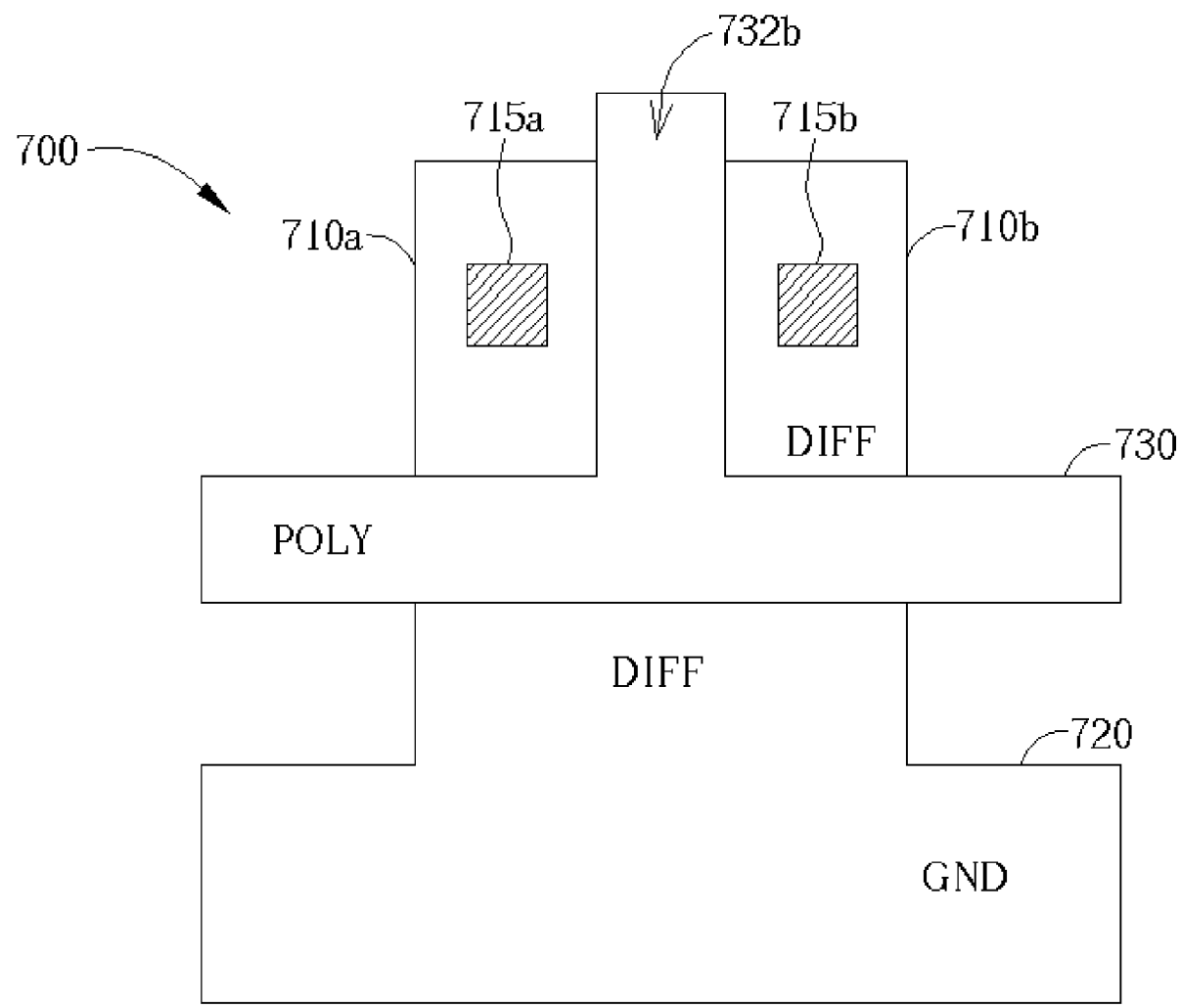
FIG. 7 is a block diagram of the ROM cell according to the second embodiment of the present invention.
Figure 8:
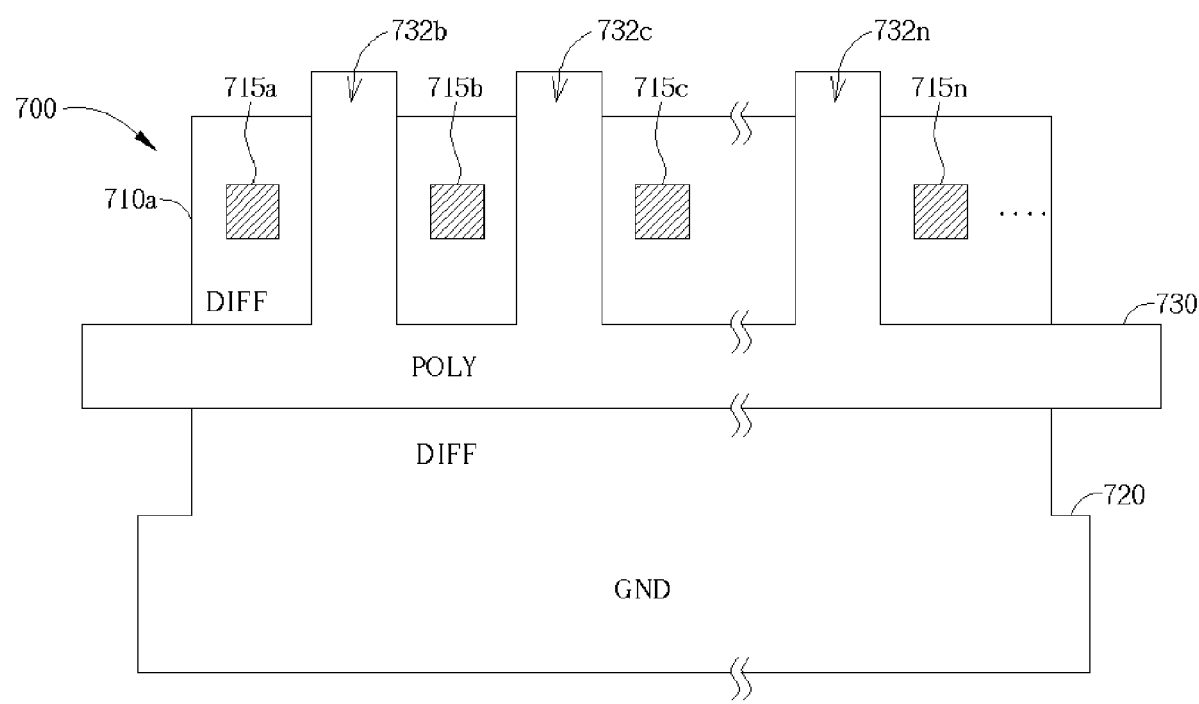
FIG. 8 is a block diagram of an optimal variation of the ROM cell shown in FIG. 7.

Please refer to FIG. 7 showing a block diagram of a ROM cell, and FIG. 8 showing a block diagram of an optimal variation of the ROM cell shown in FIG. 7, both of which are according to the second embodiment of the present invention. A gate 730 according to the second embodiment is also made of polysilicon. A plurality of drain doped regions 710a, 710b, 710c . . . and a common source doped region 720 are doped wells formed by a conventional diffusion process.

The difference between FIG. 8 and FIG. 7 is in the number of plurality of drain doped regions 710a, 710b, 710c . . . and corresponding gate extension structures 732b, 732c . . . The number of the plurality of drain doped regions represents how many bits the ROM cell can store, which is equal to the number of the plurality of drain signals. For instance, a ROM cell 700 having N drain doped regions 710a, 710b, 710c . . . 710n (representing respectively the first, the second, the third . . . the $N^{th}$ drain doped region) can store N bits. The following description is related to the second embodiment shown in FIG. 7, wherein the ROM cell 700 has 2 drain doped regions 710a, 710b for storing 2 bits.

According to the second embodiment shown in FIG. 7, the present invention provides another high density ROM cell 700 installed on a silicon substrate for storing data. The ROM cell 700 includes a plurality of first doped regions 710a, 710b installed on the silicon substrate and having a second conductive type (N-type in this embodiment; that is, the plurality of first doped regions 710a, 710b are N-type doped wells), a second doped region 720 installed on the silicon substrate having the second conductive type (N-type doped well), and a gate 730 installed on the surface of the silicon substrate and adjacent to the plurality of first doped regions 710a, 710b and the second doped region 720. The plurality of first doped regions 710a, 710b are drain doped regions, the second doped region 720 is a source doped region, and the gate 730 has at least one extension structure located respectively between one first doped region 710a and the other first doped region 710b so that a plurality of drain signals (two in this embodiment, not shown in FIG. 7) respectively passing the plurality of first doped regions 710a, 710b will not interfere with each other.

In the present invention, the ROM cell 700 is installed in a doped well (not shown in FIG. 7) on the silicon substrate having the first conductive type (P-type in this embodiment; that is, the doped well is a P-type doped well). Such kind of structure is optional, and does not limit the present invention.

Figure 9:
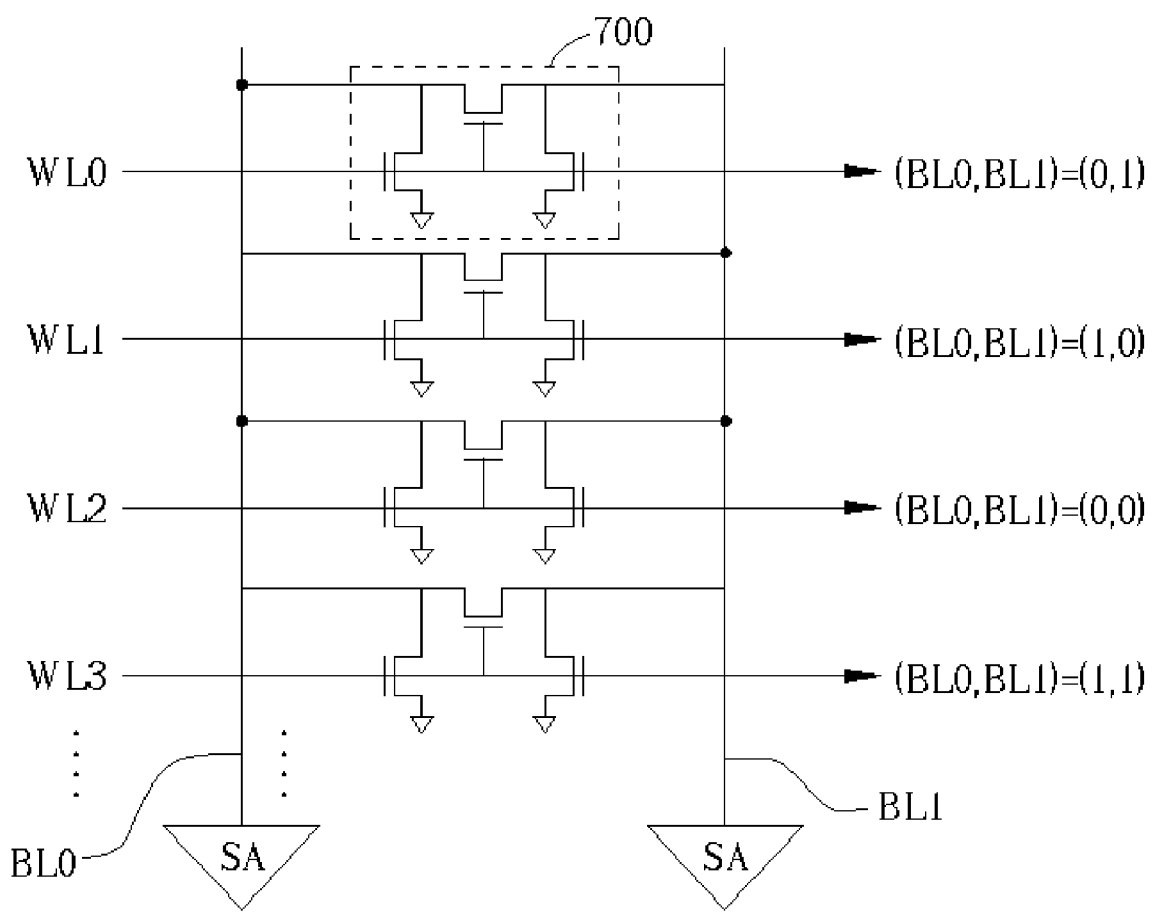
FIG. 9 is a circuit diagram of the ROM cell array according to the second embodiment of the present invention.
Figure 10:
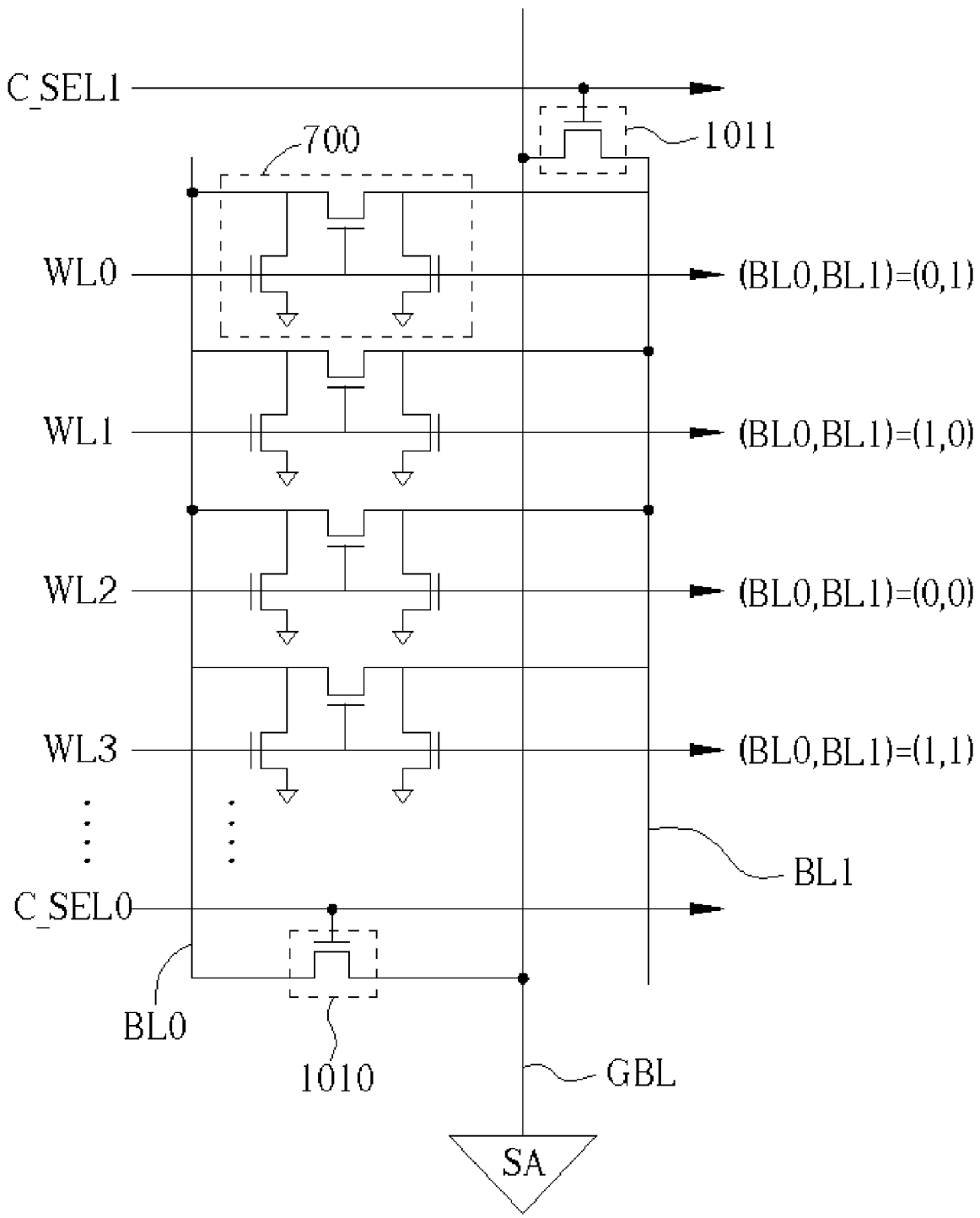
FIG. 10 illustrates a combination of the circuit in FIG. 9 and a global bit line.

Please refer to FIG. 9 showing a circuit diagram of the ROM cell array, and FIG. 10 showing a combination of the circuit in FIG. 9 and a global bit line. The ROM cell 700 in FIG. 9 and FIG. 10 is an equivalent circuit to the ROM cell 700 in FIG. 7, wherein a single ROM cell 700 can store a plurality of bits (2 bits in this embodiment) of data in order to provide a higher density on data storage. As shown in FIG. 9 and FIG. 10, the plurality of bits of data can be read by a plurality of bit lines BL0, BL1 (two in this embodiment). As shown in FIG. 9, the data read by the bit lines BL0, BL1 are transmitted to a bit line output SA. The global bit line GBL in FIG. 6 controls a plurality of bit line switches 1010, 1011, through a plurality of column selection lines C_SEL0, C_SEL1, to multiplex data read by one of the bit lines BL0, BL1 and transmit them to the bit line output SA. In other words, the circuit in FIG. 10 is a combination of the circuit in FIG. 9 and a Y-MUX. Therefore, both FIG. 9 and FIG. 10 show that the present invention provides higher storage density than the prior art. In addition, bit read values (BL0, BL1)=(0, 1), (1, 0), (0, 1), (1, 1) marked on the right side of word lines WL0, WL1, WL2, WL3 in FIG. 9 and FIG. 10 correspond to drain terminals 715a, 715b and the programmed (shown by a black dot) or unprogrammed (without black dot) status between the bit lines BL0, BL1 of each ROM cell 700.

In the present invention, the first conductive type is P-type and the second conductive type is N-type. However, it is optional and does not limit the present invention. In another possible embodiment of the present invention, the first conductive type can be N-type and the second conductive type can be P-type.

In contrast to the prior art, the high-density ROM cell according to the present invention has a plurality of drains, a common gate, and a common source. Since such kind of the structure composed of the common devices provides a manner for operating a plurality of drain signals, a single memory cell can store a plurality bits of data, which has a higher density than that of the prior art, and accordingly, the circuit area can be reduced.

In addition, the high-density ROM cell according to the present invention has a structure similar to a MOS transistor so that it can be applied in any of the related products, and designed or manufactured in a easy manner.

Those skilled in the art will readily observe that numerous modifications and alterations of the device may be made while retaining the teachings of the invention. Accordingly, the above disclosure should be construed as limited only by the metes and bounds of the appended claims.

The invention claimed is:

1. A read-only memory (ROM) memory array installed on a silicon substrate, the memory array comprising a plurality of high density ROM cells, each ROM cell comprising:
a common gate installed on the surface of the silicon substrate;
a common source of a first conductive type installed on the silicon substrate adjacent to the common gate; and
a plurality of heavily doped drains of a second conductive type installed within a doped region of the first conductive type on the silicon substrate, the doped region of the first conductive type being adjacent to the common gate.

2. The memory array of claim 1 further comprising a plurality of bit lines connected to the plurality of ROM cells installed on the silicon substrate.

3. The memory array of claim 2 wherein a number of bit lines connected to one of the plurality of ROM cells is equal to the number of heavily doped drains for said one of the plurality of ROM cells.

4. The memory array of claim 3 wherein each of the heavily doped drains for said one of the plurality of ROM cells is connected to a different bit line.

5. The memory array of claim 4 further comprising a switch connected to the plurality of bit lines for selectively accessing one of the heavily doped drains of said one of the plurality of ROM cells.

6. The memory array of claim 1 further comprising means of individually storing data or accessing data stored in each of the heavily doped drains of one of the plurality of ROM cells utilizing the common gate and the common source of said one of the plurality of ROM cells.

7. A high density ROM cell installed on a silicon substrate for storing data, comprising:
a plurality of drain doped regions being of a second conductive type installed on the silicon substrate, each of the plurality of drain doped regions is coupled to a different bit line of a plurality of bit lines and the plurality of bit lines is coupled to a switching circuit for selectively outputting one of the plurality of drain signals;
a common source doped region being of the second conductive type installed on the silicon substrate; and
a common gate installed on the surface of the silicon substrate and adjacent to the plurality of drain doped regions and the source doped region, the gate having at least one extension structure respectively located between one of the plurality of drain doped regions and another of the plurality of drain doped regions so that a plurality of drain signals respectively passing through the plurality of drain doped regions do not interfere with each other.

8. The ROM cell of claim 7 installed in a doped well being of a first conductive type on the silicon substrate.

9. The ROM cell of claim 8 wherein the first conductive type is P-type, and the second conductive type is N-type.

10. The ROM cell of claim 8 wherein the first conductive type is N-type, and the second conductive type is P-type.

11. The ROM cell of claim 7 wherein the second conductive type is N-type.

12. The ROM cell of claim 7 wherein the second conductive type is P-type.

13. A high density ROM cell installed on a silicon substrate for storing data, comprising:
a plurality of drain doped regions being of a second conductive type installed on the silicon substrate;
a common source doped region being of the second conductive type installed on the silicon substrate; and
a common gate installed on the surface of the silicon substrate and adjacent to the plurality of drain doped regions and the source doped region, the gate having at least one extension structure respectively located between one of the plurality of drain doped regions and another of the plurality of drain doped regions so that a plurality of drain signals respectively passing through the plurality of drain doped regions do not interfere with each other;
wherein the ROM cell is installed in a doped well of a first conductive type that is of an opposite type from the second conductive type.

* * * * *